United States Patent [19]

Takatori et al.

[11] Patent Number: 4,687,998

[45] Date of Patent: Aug. 18, 1989

[54] PULSE WIDTH GENERATING CIRCUIT SYNCHRONIZED WITH CLOCK SIGNAL AND CORRESPONDING TO A REFERENCE VOLTAGE

[75] Inventors: Hiroshi Takatori, Kokubunji; Toshiro Suzuki, Tama; Osamu Matsubara, Kokubunji; Izuru Yamada, Totsuka, all of Japan

[73] Assignee: Hitachi, Ltd., Tokyo, Japan

[21] Appl. No.: 759,865

[22] Filed: Jul. 29, 1985

[30] Foreign Application Priority Data

Jul. 27, 1984 [JP] Japan .................... 59-155246

[51] Int. Cl.⁴ ................ H03K 3/17; H03K 5/22; H03K 5/159; H03K 5/00

[52] U.S. Cl. .................... 328/58; 307/246; 307/265; 307/494; 307/352; 307/362; 328/127; 328/151

[58] Field of Search ............ 307/352, 353, 228, 227, 307/494, 246, 265, 362; 328/127, 151, 58

[56] References Cited

U.S. PATENT DOCUMENTS

| | | | |
|---|---|---|---|
| 3,390,347 | 6/1968 | Jones et al. ............... | 328/151 |
| 3,512,140 | 5/1970 | Yokozawa et al. ............ | 328/151 |
| 3,719,834 | 3/1973 | Dao ............................ | 307/228 |
| 3,778,725 | 12/1973 | Spaargaren et al. ............ | 328/151 |

*Primary Examiner*—Stanley D. Miller
*Assistant Examiner*—Trong Quang Phan
*Attorney, Agent, or Firm*—Antonelli, Terry & Wands

[57] ABSTRACT

A pulse generating circuit is provided for generating a pulse having a time width synchronized with an input pulse and corresponding to a reference voltage. The circuit is particularly designed not to be affected by parasitic capacitance. A circuit for charging one electrode of an integrating circuit with a constant current is controlled by turning on or off a switch in response to the input pulse. The other electrode of the integrating capacitor is connected with a reference voltage source by driving a switch in response to a pulse having a pulse width which contains the time period of the input pulse and which is wider than the input pulse. A comparator is provided for comparing the potential at one electrode of the integrating capacitor and ground potential. A desired pulse is generated by a logic circuit which is receives both the output of the comparator and the input pulse.

6 Claims, 3 Drawing Figures

PULSE WIDTH GENERATING CIRCUIT SYNCHRONIZED WITH CLOCK SIGNAL AND CORRESPONDING TO A REFERENCE VOLTAGE

BACKGROUND OF THE INVENTION (1) Field of the Invention

The present invention relates to a pulse generating circuit and, more particularly, to a pulse generating circuit for generating a pulse having a time width synchronized with a clock signal coming from the outside and corresponding to a reference voltage.

(2) Description of the Prior Art

As a voltage generating circuit for generating a signal having a specified voltage waveform, there is known in the art a voltage signal generating circuit for generating a pulse signal having a predetermined time width and period to feed a constant current in response to the pulse signal and for driving a switch to charge and discharge a capacitor thereby generating the potential of the capacitor as the signal having the above-specified voltage waveform.

In order to generate the voltage signal having the desired waveform, the aforementioned voltage signal generating circuit is required to have that pulse signal synchronized with an external signal (such as a clock signal) thereby to generate pulses having a time width corresponding precisely to the reference voltage. An example of such a pulse generating circuit which we developed in an integrated circuit (IC), is shown in Japanese Patent Laid-Open No. 58-92258, "Voltage Generating Circuit" by Matsubara et al. This circuit generates pulses having a time width synchronized with the period of an external clock signal and proportional to the value of a reference voltage. This is accomplished by feeding a constant current to an integrating capacitor through a switch to be turned on or off in synchronism with that clock signal, by comparing the potential of the integrating capacitor with that reference voltage by means of a comparator, and by feeding that clock signal and the output signal of that comparator to a logic circuit.

In this earlier circuit, however, the pulse width cannot be so correctly set as to be proportional to that reference voltage because of the parasitic capacitances such as the input gate capacitor of the circuit constructing that comparator, the junction capacitance of the transistor composing the current source or other wiring capacitors. In order to reduce the influences of those parasitic capacitances, it is sufficient to set the capacitance of that integrating capacitor at a large value. However, this is impractical if it is to be realized by a large scale integrated circuit (LSI).

SUMMARY OF THE INVENTION

It is, therefore, an object of the present invention to provide a highly precise pulse generating circuit, in which a time width corresponding to a reference voltage can be made independent of the uncertain and highly fluctuating parasitic capacitances such as the input gate capacitance of the comparator when it is to be integrated into an LSI for generating a pulse signal having that time width.

In order to achieve the above-specified object, according to the present invention, the circuit is so constructed to eliminate the errors due to the parasitic capacitances, that the charge and discharge of the parasitic capacitances may be offset when an integrating capacitor has its initial charge set by the reference voltage and is charged by a constant current. The charge of the integrating capacitor is grounded to the earth potential (at a first potential) before its charging operation, in which the potential of one electrode of the integrating capacitor is connected with a reference voltage source (at a second potential).

BRIEF DESCRIPTION OF THE DRAWINGS

The above and still further objects and features of the present invention will become apparent upon consideration of the following detailed description of one specific embodiment thereof especially when taken in conjunction with the accompanying drawings, in which.

DESCRIPTION OF THE PREFERRED EMBODIMENT

Figure 1:
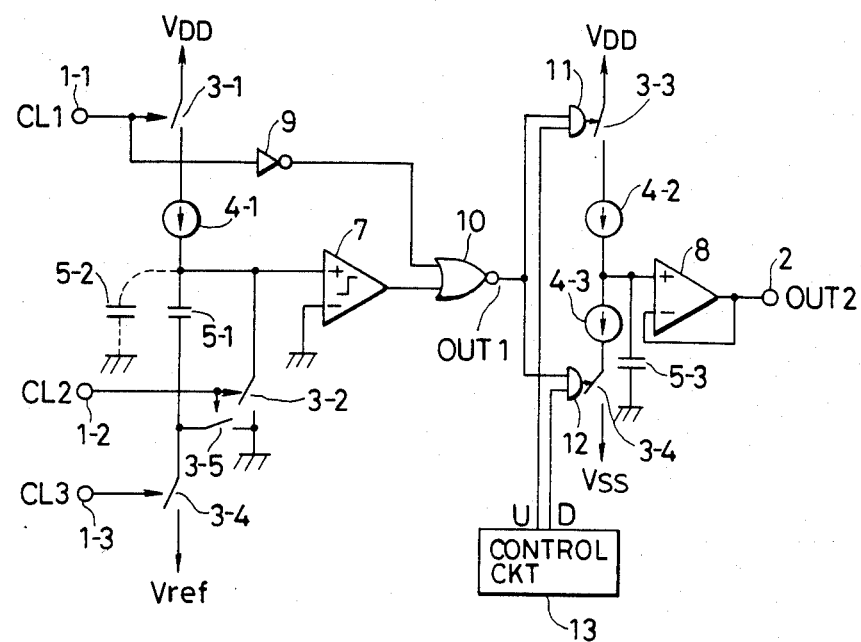
FIG. 1 is a circuit diagram illustrating a voltage signal generating circuit used with a pulse generating circuit of the present invention.

FIG. 1 is a circuit diagram illustrating one embodiment of a circuit for generating a signal having a predetermined voltage waveform by using the pulse generating circuit of the present invention.

As shown, a clock pulse signal CL1 is fed from an input terminal 1-1 to turn on or off an on-off switch 3-1 for controlling a constant current source 4-1 and a power supply $V_{DD}$. Specifically, the switch 3-1 is turned on, when the clock pulse CL1 is at a high level, and off when the clock pulse CL1 is at a low level. An integrating capacitor 5-1 has its one electrode connected directly with the constant current source 4-1 and its other electrode connected with a reference voltage source (having a voltage value $V_{ref}$) through a switch 3-4 which is to be driven by a clock signal CL3 fed from an input terminal 1-3. The switch 3-4 is turned on, when the clock pulse CL3 is at the high level, and off when the clock pulse CL3 is at the low level.

The upper and lower electrodes of the integrating capacitor 5-1 are grounded to the earth (i.e., at a first potential), respectively, by switches 3-2 and 3-5 which are to be driven by a clock pulse signal CL2 fed from an input terminal 1-2. The upper electrode of the integrating capacitor is connected with the positive input terminal of a comparator 7, in which it is compared with the earth (or first) potential.

An inverter (i.e., NOT circuit) 9 and a NOR gate (or circuit) 10 may be considered as a logic circuit which is made receptive to two logic signals, i.e., the aforementioned clock signal CL1 and the output of the comparator 7 and which has a logic output designated by OUT1. This logic output OUT1 takes the high level when the clock pulse CL1 is at the high level (so that the output of the NOT circuit 9 is at the low level) and when the output of the comparator 7 is at the low level.

A capacitor 5-2 expresses the total sum of the parasitic capacitances. The description thus far made concerns the pulse generating circuit according to the present invention. In the present embodiment, however, there is constructed the voltage generating circuit for generating the voltage of a predetermined voltage waveform by making use of the above-specified pulse generating circuit.

The output of the NOR circuit 10 is applied to AND circuits 11 and 12, which are also fed with pulses U and D from a control circuit 13. In response to the logic output OUT1, the AND circuits 11 and 12 turn on switches 3-3 and 3-4, respectively, when the pulses U and D are at the high level, and turn off the switches 3-2 and 3-4 when the pulses U and D are at the low level.

As a result, a capacitor 5-3 is charged through the power supply $V_{DD}$ and a constant current source 4-2, when the switch 3-3 is turned on, and is discharged through a power supply $V_{SS}$ and a constant current source 4-3 when the switch 3-4 is turned on.

The potential at one electrode of the capacitor 5-3 is output as an output signal OUT2 through a buffer amplifier 8 from an output terminal 2.

The operations of the aforementioned embodiment will be described in the following with reference to the time chart of FIG. 2.

First of all, the clock CL2 has the same period as that of the clock CL1 and is generated in the absence of the pulses of the clock CL1 to connect the respective two electrodes of the integrating capacitor 5-1 and the parasitic capacitor 5-2 with the earth potential thereby to discharge, i.e., reset the same.

Next, after the breakage of the pulses of the clock CL2, there is applied the clock CL3 which has a rise before the rise of the clock CL1. In other words, the clock pulse CL3 has a pulse width extending for a time in which the clock pulse CL2 is absent whereas the clock pulse CL1 is present. Since the switch 3-4 is turned on in response to the clock pulse CL3, the potential $V'_{ref}$ of the upper electrode of the integrating capacitor 5-1 is expressed by:

$$V'_{ref} = C_1/(C_1+C_2) \cdot V_{ref} \qquad (1)$$

Here, $C_1$ and $C_2$ designate the respective capacitances of the capacitors 5-1 and 5-2. If, in this state, the clock CL1 is applied, the potential of the upper electrode of the capacitor 5-1 rises so that the time T before the earth potential is reached is expressed by:

$$T = (C_1+C_2)/I_{4-1} \cdot V'_{ref} \qquad (2)$$

where $I_{4-1}$ is the current value of the constant current source 4-1.

If equation (1) is substituted into the equation (2), the time is transformed into:

$$T = -C_1/I_{4-1} \cdot V_{ref} \qquad (3)$$

As a result, there is generated at the output terminal of the NOR circuit 10 the pulse OUT1 having such a constant time width T as is independent of the parasitic capacitor 5-2.

The pulse OUT1 having the time width expressed by equation (3) is applied to the AND circuits 11 and 12. The switch 3-3 is turned on, when it is fed with the pulse U for turning on the AND circuits from the control circuit 13, so that the capacitor 5-3 (having a capacitance $C_3$) is charged for the time T by the constant current coming from the constant current source 4-2 (having a constant current $I_2$). As a result, the potential of the capacitor 5-3 is raised by:

$$\Delta V = I_2/C_3 \cdot T = I_2/I_{4-1} \cdot C_1/C_3 \cdot V_{ref} \qquad (4)$$

The switch 3-4 is turned on, when it is fed with the pulse D for opening the AND circuit 12, so that the capacitor 5-3 is discharged for the time T by the constant current coming from the constant current source 4-3 (having the constant current $I_2$). As a result, the potential of the capacitor is reduced by:

$$\Delta V = I_2/I_{4-1} \cdot C_1/C_3 \cdot V_{ref}.$$

The control circuit 13 is used to generate the pulses U and D so as to generate the predetermined voltage waveform.

The potential of the capacitor 5-3 is extracted through the buffer amplifier 8 from the output terminal 2.

Figure 2:
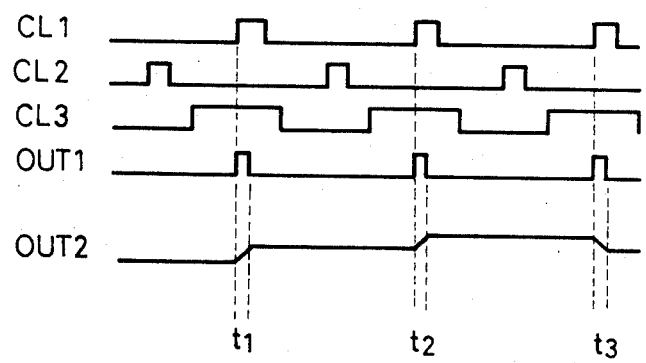
FIG. 2 is a time chart for explaining the operations of the circuit of FIG. 1.

FIG. 2 illustrates the relationships among the clock pulses CL1, CL2 and CL3, the output OUT1 of the NOR circuit 10, and the output OUT2 of the output terminal 2 of the aforementioned embodiment. At instants $t_1$ and $t_2$, the switch 3-4 is turned on and the switch 3-4 is turned off. At an instant $t_3$, the switch 3-3 is turned off whereas the switch 3-4 is turned on.

As has been described in connection with the embodiment, the voltage generating circuit can be realized without being adversely affected by the parasitic capacitor 5-2. The embodiment exemplifies the case in which the current sources 4-1, 4-2 and 4-3 are constructed separately from one another. Since a highly precise relation can be easily realized by the usual current mirror circuit, however, the voltage generating circuit thus far described can generate a highly precise voltage independent of the fluctuations of the absolute value of the current.

Figure 3:
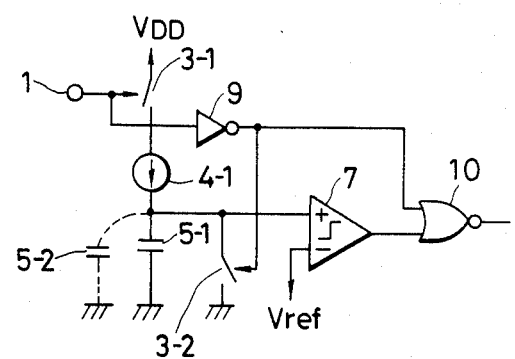
FIG. 3 is a circuit diagram illustrating a pulse generating circuit made by us prior to the present invention.

In order to better clarify the effects of the present invention, FIG. 3 is a circuit diagram illustrating the pulse generating circuit which is used for the same purpose of that of the present invention, as it has already been submitted for patent by us. The same circuit elements appearing in FIG. 3 as those of the circuit of FIG. 1 are indicated at the common reference characters, and their detailed descriptions are omitted. The difference from the present invention is found in the discharge driving unit of the capacitor 5-1 and the connecting position of the reference voltage source ($V_{ref}$).

In the shown circuit, the switch 3-2 is turned on by the output of the NOT gate 9, when the switch 3-1 is turned off, so that the integrating capacitor 5-1 and the parasitic capacitor are discharged. Simultaneously as the switch 3-1 is turned on, the capacitors 5-1 and 5-2 begin to be charged. When the potential at the upper electrode of the capacitor exceeds the reference voltage $V_{ref}$, the output of the comparator is inverted. As a result, the charge of the output capacitor 5-3 is interrupted, the control voltage $\Delta V$ is expressed by the following equation and contains the uncertain parasitic capacitance $C_2$:

$$\Delta V = I_{4-2}/I_{4-1} \cdot (C_1+C_2)/C_3 \cdot V_{ref} \qquad (5).$$

This makes it impossible to precisely determine the control voltage $\Delta V$. The capacitance $C_2$ can be raised to reduce the effect without changing the circuit construction. In order to realize a control voltage of 5 mV with a precision of $\pm 10\%$, however, the ratio of $(C_1+C_2)/C_3 = 1/20$ has to be made if the ratio of $I_{4-2}/I_{4-1} = 10$ $V_{ref} = 1$ V is assumed. If this is to be realized by the usual MOS fabricating process, however, the capacitance $C_2$ of the parasitic capacitor takes about 0.5 pF and fluctuates in accordance with the LSI fabricating process. To reduce this error to 10% or less, therefore, the capacitance $C_1$ takes a value of 5 pF, and the capacitance $C_3$ is required to have a very large value such as 110 pF, even if the ratio of $I_{4-2}/I_{4-1}$ and the reference voltage $V_{ref}$ are neglected, so that the error reduction cannot be realized by the LSI circuit.

As has been described hereinbefore in connection with the aforementioned embodiment, on the contrary the pulse width T does not fluctuate as a result of parasitic capacitor 5-2 in accordance with the present invention. For example, in case the embodiment is to be used with the voltage generating circuit of FIG. 1, the control voltage V is determined by the capacitor ratio $C_1/C_3$ and the reference voltage $V_{ref}$, and the following values suffice to realize the control voltage $\Delta V$ (e.g., 5 mV in the precision of ±10%) equivalent to the characteristics of the aforementioned example of the prior art:

$$I_2/I_1 = N = 10;$$

$$V_{ref} = -1\ V;$$

$$C_1 = 1\ p;$$

and $$C_3 = 20\ p.$$

and the capacitance $C_3$ is reduced to 1/5 or lower, as compared with the prior art example.

What is claimed is:

1. A pulse generating circuit comprising:
   an integrating capacitor having first and second electrodes;
   a first circuit for feeding a constant current to the first electrode of said integrating capacitor through a first switch means which is driven by a first pulse signal;
   a second circuit having a second switch means for connecting the first and second electrodes of said integrating capacitor with a first potential in response to a second pulse signal;
   a third circuit for connecting the second electrode of said integrating capacitor with a power supply having a reference voltage in response to a third pulse signal having such a predetermined time width so that the first and second electrodes of said integrating capacitor are not connected with said first potential by the second switch means and so that said constant current is fed to the first electrode of said integrating capacitor;
   a comparator connected to said first electrode of said integrating capacitor for comparing the potential at said first electrode of said integrating capacitor and said first potential; and
   a logic circuit connected to said comparator output and coupled to receive said first pulse signal, said logic circit including means for generating a pulse having a predetermined time width corresponding to said reference voltage.

2. A pulse generating circuit according to claim 1, wherein said first voltage is at ground potential.

3. A pulse generating circuit according to claim 1, wherein said logic circuit includes: a NOT circuit coupled to receive said first pulse signal; and a NOR circuit coupled to of both the output of said NOT circuit and the output of said comparator.

4. A pulse generating circuit according to claim 2, wherein said logic circuit includes: a NOT circuit coupled to receive said first pulse signal; and a NOR circuit coupled to both the output of said NOT circuit and the output of said comparator.

5. A pulse generating circuit comprising:
   a first voltage source, a second voltage source and a reference voltage source;
   a first switch, a constant current source, an integrating capacitor having first and second terminals and a second switch means connected in series in the recited order between said second voltage source and said reference voltage source;
   a third switch for connecting the first and second terminals of said integrating capacitor and a ground potential;
   first, second and third pulse signals for driving said first, second and third switch means, respectively;
   a comparator connected to one of said first terminal of said integrating capacitor, said comparator including an operational amplifier for connecting a node of said first terminal of said integrating capacitor and said constant current source with a positive input terminal and said first power supply with a negative input terminal; and
   a logic circuit connected to said comparator output and coupled to receive said first pulse signal, said logic circuit including means for generating a pulse which has a predetermined time width corresponding to the voltage of said reference voltage source and which is synchronized with said first pulse.

6. A pulse generating circuit according to claim 5, wherein said logic circuit includes: a NOT circuit coupled to receive said first pulse signal; and a NOR circuit coupled to the outputs of both said NOT circuit and said comparator.

* * * * *

UNITED STATES PATENT AND TRADEMARK OFFICE
CERTIFICATE OF CORRECTION

PATENT NO.   : 4,687,998
DATED        : Aug. 18, 1989
INVENTOR(S)  : H. Takatori et al It is certified that error appears in the above-identified patent and that said Letters Patent is hereby corrected as shown below:

On the Title Page:

"Date of Patent: Aug. 18, 1989"

should read:

--Date of Patent: Aug. 18, 1987--

Signed and Sealed this

Thirty-first Day of July, 1990

Attest:

HARRY F. MANBECK, JR.

Attesting Officer

Commissioner of Patents and Trademarks